United States Patent
Lee (12)

(10) Patent No.: US 6,248,408 B1
(45) Date of Patent: Jun. 19, 2001

(54) METHOD FOR SIMULTANEOUSLY CURING POWDER UNDERLAYER COATING AND PVD DEPOSITION OF THIN FILM LAYER

(75) Inventor: Brent W. Lee, San Jose, CA (US)

(73) Assignee: Vacuum Plating Technology Corporation, San Jose, CA (US)

(*) Notice: Subject to any disclaimer, the term of this patent is extended or adjusted under 35 U.S.C. 154(b) by 0 days.

(21) Appl. No.: 09/261,933

(22) Filed: Mar. 3, 1999

(51) Int. Cl.[7] .................................................. C23C 14/00
(52) U.S. Cl. .......................... 427/475; 427/485; 427/580; 427/250; 427/385.5; 427/386; 204/192.38
(58) Field of Search ..................................... 427/475, 485, 427/580, 250, 385.5, 386; 204/192.38

(56) References Cited

U.S. PATENT DOCUMENTS

| | | | |
|---|---|---|---|
| 5,219,493 | * | 6/1993 | Seshadri . |
| 5,221,349 | * | 6/1993 | Tamagaki . |
| 5,229,233 | * | 7/1993 | Riddle et al. . |
| 5,683,756 | * | 11/1997 | Tanner et al. . |

* cited by examiner

Primary Examiner—Timothy Meeks
(74) Attorney, Agent, or Firm—Robert O. Guillot; Oppenheimer Wolff & Donnelly LLP

(57) ABSTRACT

In the generalized method of the present invention a heat curable coating is first applied to an article of manufacture. Thereafter, an outer coating is applied to the article in a physical vapor deposition process, and the heat from the PVD process cures the first layer while the PVD coating is being deposited upon the article. In the preferred embodiments, the heat curable coating is a powder coating and the cathodic arc of the PVD process provides the heat that cures the powder coating. An infrared heat source within the PVD chamber may be utilized to preheat the powder coating which is typically composed of an epoxy-polymer compound. Articles of manufacture having the coating of the present invention formed thereon are manufactured with less energy and labor costs.

17 Claims, 1 Drawing Sheet

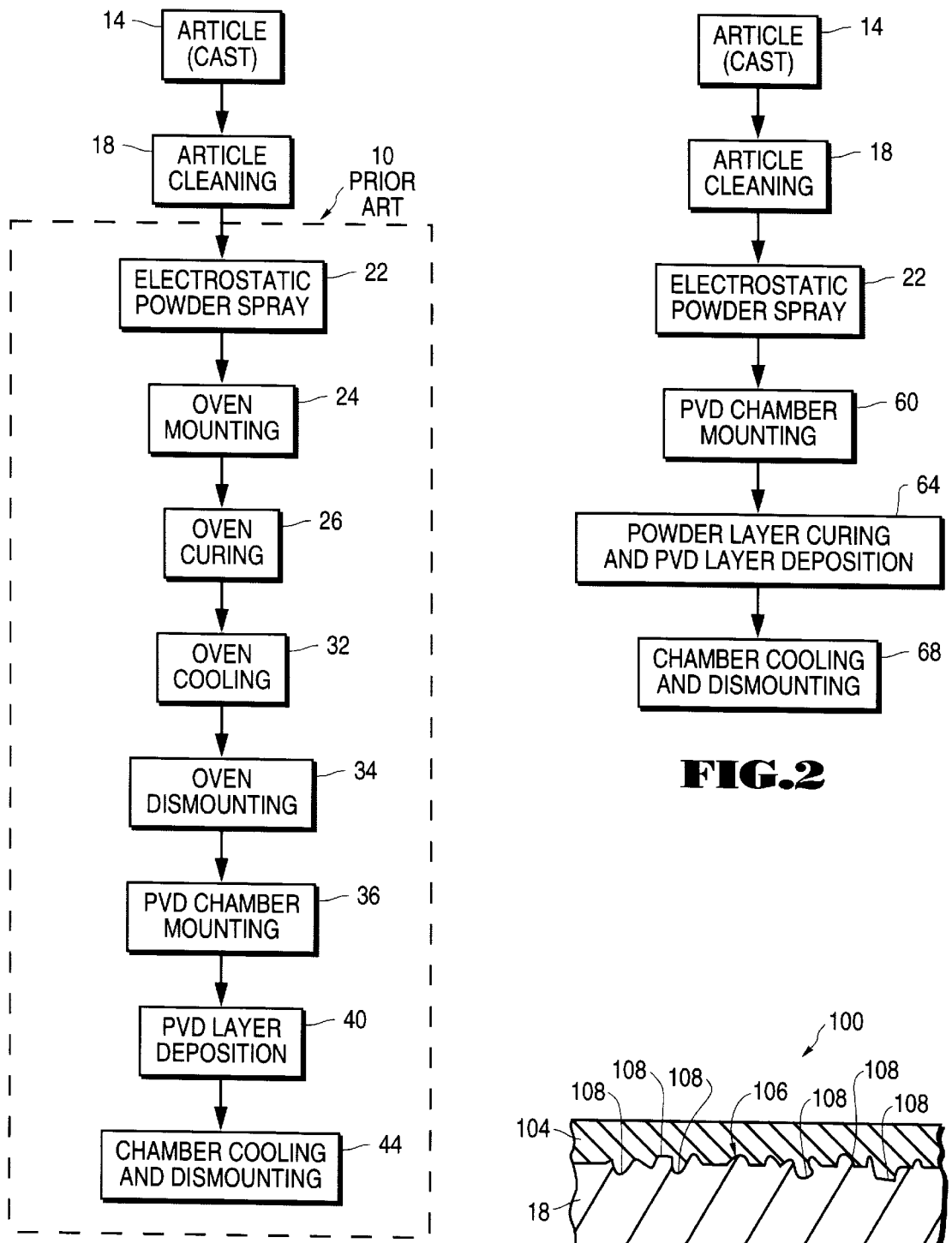

METHOD FOR SIMULTANEOUSLY CURING POWDER UNDERLAYER COATING AND PVD DEPOSITION OF THIN FILM LAYER

BACKGROUND OF THE INVENTION

1. Field of the Invention

The present invention related generally to cathodic arc plasma physical vapor deposition processes, and more particularly to multiple layer formation processes.

2. Description of the Prior Art

The present invention basically comprises a combination of electrostatic powder coating techniques with cathodic arc plasma physical vapor deposition techniques, and has particular application to the coating of cast articles of manufacture composed of metal, plastic or other materials. Cast articles of manufacture typically have many voids and pits in the outer surface of the cast article, and it is desirable to remove or eliminate these voids and pits. Utilizing the prior art electrostatic powder coating process, an electrically charged powder coating is applied to an electrically grounded, cleaned cast article of manufacture. In this process, an electrostatic spray gun is utilized to spray a diffused cloud of electrically charged powder particles onto the grounded article. Following the powder layer application, the article is mounted into an oven to cure the powder layer. A typical curing process involves heating the powder coated article to a temperature of approximately 350° Fahrenheit for approximately 15–20 minutes. During the curing process the powder material melts and hopefully flows into the surface voids and pits to fill them. The melted outer surface of the powder layer thus becomes smooth. Following cooling and removal of the article from the oven, the article now has a smooth outer surface instead of the cast surface with its voids and pits. The cured powder layer also acts as a corrosion resisting layer on the outer surface of the article.

Typically, the prior art cured powder coating layer is relatively soft and lacking in aesthetic appeal. Therefore, an outer layer has been applied to the powder coated article, and the utilization of a cathodic arc plasma physical layer deposition process is known. In this outer layer deposition process, the article having a cured underlayer is mounted within the chamber of a PVD device and a vacuum atmosphere is created. Thereafter, the cathodic arc is struck and an outer layer is deposited upon the article. Typical outer layers consist of metal or metal compounds such as chromium, ZrN and TiN. Following deposition of the outer layer, the article is cooled and then removed from the PVD chamber. A high gloss, scratch resistant outer surface is provided to the article of manufacture, whereby a two layer overall coating process is completed.

A first problem with this two layer prior art process is that air bubbles sometimes become trapped in the voids and pits during the powder layer curing step. Following completion of the curing step the outer surface of the cured powder layer is smooth, however, the trapped air bubbles remain. Thereafter, when the article is placed within the PVD chamber and the vacuum is created, the air bubbles expand and often explode through the surface of the cured undercoat layer, thus creating pits and craters in the outer surface. The subsequent deposition of the PVD layer does not fully fill these pits and craters, whereupon a marred outer surface is obtained. A second problem with the prior art process, as compared to the present invention which is described herebelow, is that the prior art process unnecessarily utilizes energy and time in the oven mounting and curing process steps. As is next described, the present invention eliminates the oven mounting and curing process.

SUMMARY OF THE INVENTION

In the generalized method of the present invention a heat curable coating is first applied to an article of manufacture. Thereafter, an outer coating is applied to the article in a physical vapor deposition process, and the heat from the PVD process cures the first layer while the PVD coating is being deposited upon the article. In the preferred embodiments, the heat or ultraviolet curable coating is a powder coating and the cathodic arc of the PVD process provides the heat or ultraviolet that cures the powder coating. An infrared heat source within the PVD chamber may be utilized to preheat the powder coating which is typically composed of an epoxy-polymer compound. Articles of manufacture having the coating of the present invention formed thereon are manufactured with less energy and labor costs.

It is an advantage of the present invention that a coating process is developed which saves labor and energy over the prior art process.

It is another advantage of the present invention that a more rapid deposition process is provided.

It is a further advantage of the present invention that a deposition process is provided which develops a surface coating having fewer voids and pits.

It is still another advantage of the present invention that a deposition process is provided which combines the prior art two coating processes into a single coating process.

It is still a further advantage of the present invention that an article of manufacture is provided having an improved outer coating.

It is yet another advantage of the present invention that an article of manufacture is provided having a single layer which fills voids and pits in the surface of the article of manufacture is corrosion resistant and has a hard outer surface.

These and other features and advantages of the present invention will become understood by those skilled in the art upon reading the following detailed description which makes reference to the several figures of the drawings.

IN THE DRAWINGS

FIG. 1 is a flow chart of the method steps of the prior art deposition process;

FIG. 2 is a flow chart of the method steps of the present invention; and

FIG. 3 is a side cross-sectional view of the article of manufacture having a coating of the present invention formed thereon.

DETAILED DESCRIPTION OF THE PREFERRED EMBODIMENTS

The coating process of the present invention improves the generally eight step coating process of the prior art by reducing it to generally four steps. The coating process is principally, though not exclusively, applicable to an article of manufacture 14, such as a cast metal object, whose outer surface is first cleaned following the casting thereof. In the prior art coating process 10, the article of manufacture is first given an undercoating to provide corrosion resistance and to fill small surface voids and pits. Typically, the undercoating is a powder coating 22 that is applied by spraying the powder in a well known electrostatic process, and typically, the powder is electrostatically applied to a thickness of approximately 10 mils. After the powder layer is electrostatically applied to the article, the article is mounted 24 in an oven and then cured 26 such as by baking it in the oven to a time and temperature that melts the powder, causing it to hopefully fill the surface voids and pits and form a smooth outer surface. Following curing 26, the article is cooled 32 to room temperature, dismounted 34 from the oven, and the underlayer is formed.

Suitable powder coatings include polyesters, acrylics, epoxies and hybrid combinations thereof, and such powders may be cured by heat energy or ultraviolet energy. A suitable heat curable powder is in epoxy-polyester based compound, such as ENVIROCRON, a PPG Industries, Inc. trademark, product code PCF 70117 available from PPG Industries, Inc., Pittsburg, Pa.

Thereafter, a hard, high gloss metallic finish layer is applied for scratch resistance and aesthetic reasons. The outer layer is applied utilizing a standard prior art cathodic arc plasma physical vapor deposition (PVD) process utilizing an electric arc to create the plasma from a suitable target, typically composed of a metal or metallic compound such as chromium, ZrN or TiN for example. In the PVD process, the underlayer coated article is mounted 36 in an electric arc PVD chamber, a vacuum is created, and the deposition process 40 is conducted. After the PVD process is finished, the article is cooled and dismounted 44 from the PVD chamber, and the two-layer article, having the cured powder coated underlayer and the PVD outer layer is complete. It has been found with the prior art process that curing the powder coating at atmospheric pressure can leave small air pockets within the surface voids and pits. Thereafter, when the article is placed within the PVD chamber and the vacuum is created, the air within the air pockets expands and may explode through the cured surface of the undercoating, creating pits and craters in the cured underlayer surface which show through and ruin the PVD finish layer.

The present invention seeks to avoid the creation of the expanding air pits and to shorten the processing time of the prior art, as described above, by eliminating the powder layer oven mounting 24, curing 26 cooling 32 and dismounting 34 steps by accomplishing the powder layer curing during the PVD deposition step. Specifically, as depicted in FIG. 2, the cleaned article of manufacture 18 is first powder coated 22 as was done in the prior art. A preferred powder coating is formed utilizing the ENVIROCRON epoxy-polyester based powder identified above, with a thickness in the range of 10 microns to 5 mils, and a preferred thickness of approximately 1 mil. Following the application of the powder coating 22, the article is not separately oven cured, as was done in the prior art. Rather, the powder coated article 22 is directly next mounted into the PVD chamber 60 and a PVD process is commenced.

A vacuum is created within the PVD chamber. During the chamber pumping down process to create the vacuum, an infrared heater inside the chamber is turned on to pre-heat the powder coating on the articles. Preferred uniform pre-heating results are achieved when the articles are disposed on a movable structure such that all sides of the articles are exposed to the infrared heat source. Thereafter, the electric arc is struck to commence the plasma vapor deposition process 64. The arc creates significant heat within the PVD chamber as it creates the plasma for deposition of the outer layer. The arc further heats the articles within the chamber, and the heat causes the powder layer to cure while the outer layer is being deposited on the article 66. Therefore, the method of the present invention includes a simultaneous powder layer curing and outer layer deposition procedure. After the PVD process is complete, the finished articles are cooled and dismounted 68 from the PVD chamber.

It will therefore be understood that the article of manufacture 100 of the present invention, as depicted in FIG. 3, is formed with a single protective layer 104 formed on the outer surface 106 of the cleaned article 18. The layer 104 includes the cured powder which has flowed into the cracks and crevices 108 of the surface 106 to fill them, and the outer layer material from the PVD target.

An advantage of the present method is that any air pockets under the powder layer within the small surface voids and pits are eliminated due to the chamber vacuum environment, because the air within the voids and pits easily passes through the relatively loose powder layer when the vacuum is created within the chamber, thus eliminating this problem.

Another advantage of the present method is that it saves both time and energy in the coating process of an article of manufacture, thus leading to cost savings. Particularly, a saving in time occurs because the curing of the powder layer is not conducted in an oven. Therefore, the steps of mounting the powder coated article in the oven, heating the oven to cure the layer, cooling the oven and dismounting the articles from the oven are eliminated. The savings in energy relates to the energy required to heat the oven to cure the layer, and the cost savings are obvious in both the cost of the energy and the labor costs in mounting and dismounting the articles in the oven.

While the present invention has been shown and described with regard to certain preferred embodiments, it will be understood by those skilled in the art that certain alterations and modifications can be made therein without departing from the true spirit and scope of the invention. It is therefore intended by the inventors that the following claims cover all such alterations and modifications that nevertheless include the true spirit and scope of the invention.

What I claim is:

1. A method for coating an article of manufacture comprising the steps of:

applying a first coating to an article of manufacture, said first coating having the property that it requires a curing step to complete it;

depositing a second coating upon said first coating utilizing a physical vapor deposition (PVD) process, wherein said first coating is cured in said PVD process under a vacuum atmosphere.

2. A method as described in claim 1 wherein said first coating is a powder coating and wherein said step of applying said first coating includes the step of using an electrostatic powder spray process to apply said first coating.

3. A method described in claim 2 wherein said curing step utilizes heat or ultraviolet energy.

4. A method as described in claim 3 wherein said first powder coating is applied in a thickness from approximately 10 microns to approximately 5 mils.

5. A method as described in claim 4 wherein said first coating is composed of a polyester, acrylics, epoxy compound, or hybrid combination thereof.

6. A method as described in claim 5 wherein said second coating is composed of a metal.

7. A method as described in claim 5 wherein said second coating is comprised of a metal based compound.

8. A method as described in claim 1 wherein said PVD process includes the utilization of a cathodic arc to produce energy to cure said first coating.

9. A method is described in claim 8 wherein said PVD process includes the utilization of a heating device to pre-heat said first coating prior to said utilization of a cathodic arc.

10. A method for coating an article of manufacture comprising the steps of:
   applying a first coating to an article of manufacture, said first coating having the property that it requires a curing step to cure it;
   mounting said article of manufacture in a physical vapor deposition chamber;
   creating a vacuum atmosphere within said chamber;
   curing said first coating within said chamber;
   depositing material upon said first coating during said curing step;
   cooling said articles within said chamber;
   dismounting said articles from within said chamber.

11. A method as described in claim 10 wherein said steps of curing said first coating and depositing material are accomplished simultaneously.

12. A method as described in claim 10 wherein said first coating is a powder layer and wherein said curing step utilizes heat or ultraviolet energy.

13. A method as described in claim 12 wherein said powder layer is pre-heated within said chamber prior to said step of depositing material upon said powder layer.

14. A method as described in claim 12 wherein said curing step is accomplished utilizing energy generated by a cathodic arc.

15. A method as described in claim 12 wherein said powder layer has a thickness of from approximately 10 microns to approximately 5 mils prior to said curing step.

16. A method as described in claim 15 wherein said powder layer is comprised of an epoxy, a polyester, acrylic compound, or a hybrid combination thereof.

17. A method as described in claim 16 wherein said material is comprised of a metal or a metal based compound.

* * * * *